United States Patent [19]
Araki et al.

[11] Patent Number: 5,648,921
[45] Date of Patent: Jul. 15, 1997

[54] DIGITAL OPERATIONAL CIRCUIT WITH PATHMETRICS CALCULATING STEPS SIMPLIFIED

[75] Inventors: Satoru Araki; Yoshihito Shimazaki; Kenichiro Hosoda, all of Tokyo, Japan

[73] Assignee: Oki Electric Industry Co., Ltd., Tokyo, Japan

[21] Appl. No.: 495,271

[22] Filed: Jun. 27, 1995

[30] Foreign Application Priority Data

Jul. 4, 1994 [JP] Japan .................................. 6-152379

[51] Int. Cl.[6] .............................. G06F 7/38; G06F 11/10
[52] U.S. Cl. ................................ 364/715.011; 371/43
[58] Field of Search .................................. 364/736, 768, 364/715.01; 371/43

[56] References Cited

U.S. PATENT DOCUMENTS

| | | | |
|---|---|---|---|
| 5,331,664 | 7/1994 | Desperben et al. | 371/43 |
| 5,341,386 | 8/1994 | Shimoda et al. | 371/43 |
| 5,450,338 | 9/1995 | Oota et al. | 364/715.1 |

OTHER PUBLICATIONS

"DSP for Mobile Telephone by Texas Instruments, Inc., U.S. Including a Circuit for Viterbi Decoding", *Nikkei Electronics*, No. 602, pp. 15–16, publ.Nikkei BP Corp, Tokyo, Feb. 28, 1994.

K. Ueda et al, "A 16b Low–Power–Consumption Digital Signal Processor", *Technical Report of the Inst. of Electronics, Information and Communication Engineers of Japan*, ICD93–92, DSP93–53, pp. 67–74, Sep. 1993.

*Primary Examiner*—David H. Malzahn
*Attorney, Agent, or Firm*—Spencer & Frank

[57] ABSTRACT

Digital operational circuitry includes a first adder/subtractor for adding a first pathmetric to a first branchmetric to develop a first value of pathmetric, and a second adder/subtractor for subtracting the first branchmetric from a second pathmetric to develop a second value of pathmetric. The addition and subtraction are performed by the first and second adder/subrtactors complementarily to each other. The first and second values of pathmetric are compared in likelihood to each other, and in response to the results from the comparison, either of the first and second values of pathmetric is selected and stored in a storage. The circuitry also includes a third adder/subtractor for adding the pathmetric read out from the storage to a second branchmetric to develop a third value of pathmetric, and a fourth adder/subtractor for subtracting the second branchmetric from the pathmetric read out from the storage to develop a fourth value of pathmetric. The third and fourth values of pathmetric are compared in likelihood, and in response to the comparison results either of the third and fourth values of pathmetric is developed as a pathmetric.

13 Claims, 4 Drawing Sheets

DIGITAL OPERATIONAL CIRCUIT WITH PATHMETRICS CALCULATING STEPS SIMPLIFIED

BACKGROUND OF THE INVENTION

1. Field of the Invention

The present invention relates to digital operational circuitry advantageously for use in a digital signal processor (DSP) and/or a large-scale integrated circuit (LSI) for processing arithmetic and logical operations and signals.

2. Description of the Background Art

In the prior art, digital signal processors which are high in processing rate and low in power consumption are required for a specific application, such as digital mobile telephone stations. Such digital signal processors are known by "DSP for Mobile Telephone by Texas Instruments, Inc., U.S. Including a Circuit for Viterbi Decoding" Nikkei Electronics, No. 602, pp. 15–16, published by Nikkei BP Corp, Tokyo, Feb. 28, 1994, for example, which teaches circuitry exclusive to waveform equalization/Viterbi decoding with a CSS (Compare Select Store) circuit involved. Another reference, Katsuhiko Ueda, et al., "A 16b Low-Power-Consumption Digital Signal Processor" *Technical Report of The Institute of Electronics, Information and Communication Engineers of Japan*, ICD93-92, DSP93-53, pp. 67–74, Sep. 1993, also discloses the digital signal processor achieving both high performance and low power consumption with the double-speed MAC (Multiply And Accumulation) unit and ACS (Add-Compare-Select)/Block floating accelerator.

A conventional signal processor for convolutionally encoding signals is, for example, adapted to obtain the status from the pathmetrics associated with the statuses at a discrete time point preceeding the present, discrete time point at which the earlier-mentioned status is being obtained. For facilitating the signal encoding processings to be understood, now referring to FIG. 1, there are shown in the form of Trellis diagram three discrete time points $t$, t+1 and t+2, at each of which eight internal statuses are established in the convolutional encoder. The exemplified convolutional encoder is implemented by the digital signal processor with its coding rate, R=½, constraint length, K=4, and eight statuses involved. In the figure, the legend Si(t) denotes the internal status of the encoder at the time point $t$, and Pi(t) the pathmetric associated with the status Si(t), where $i$ is a null or a positive integer from unity to seven, inclusive. In addition, Bi(t+1) represents the branchmetric from discrete time points $t$ to t+1.

For example, the pathmetric $P_0$(t+1) for the status $S_0$(t+1) is determined by the following procedure. At first, the following expressions (1) and (2) are calculated:

$$P_0(t+1) = P_0(t) + B_0(t+1) \quad (1)$$

$$P_0(t+1) = P_1(t) + B_1(t+1) \quad (2)$$

The likelihood of both of the pathmetrics $P_0$(t+1) thus obtained from the expressions (1) and (2) is then evaluated, and one which is higher in likelihood is selected as the pathmetric for the status S0(t+1). Between a couple of branchmetrics $B_1$(t+1) and $B_0$(t+1), there is established the following relation:

$$B_1(t+1) = -B_0(t+1).$$

Then expression (2) may be changed to $$P_0(t+1) = P_1(t) - B_0(t+1) \quad (2a)$$

In operation, the conventional digital operational circuitry proceeds the convolutional coding from the discrete time points $t$ to t+1 in the following manner: First, at the time point t+1, the operational circuitry receives pathmetrics $P_0$(t) and $P_1$(t) together with branchmetric $B_0$(t+1), and calculates pathmetric $P_0$(t+1) on the basis of the expressions (1) and (2a) to obtain a couple of values $P_0$(t+1). The latter values are compared with each other in terms of likelihood to produce a bit representative of the results from the comparison. One of the two values $P_0$(t+1) which is higher in likelihood than the other is selected as the pathmetric for status $S_0$(t+1). The pathmetric $P_0$(t+1) thus selected is in turn stored into a storage for pathmetrics, and the results of comparison into another storage therefor. That procedure is shown in FIG. 1 as a path with the denotation of numeral "1" enclosed with a circle. In the description, the number enclosed in a circle is denoted by the corresponding number with a pair of brackets [].

The operational circuitry maintains the values of $P_0$(t), $P_1$(t) and $B_0$(t+1) used above to proceed to obtaining another pathmetric $P_4$(t+1) on the basis of the following expressions:

$$P_4(t+1) = P_0(t) - B_0(t+1) \quad (3)$$

$$P_4(t+1) = P_1(t) - B_1(t+1)$$
$$= P_1(t) + B_0(t+1) \quad (4)$$

Similarly to the process for $P_0$(t+1) mentioned above, two values of $P_4$(t+1) are obtained, and one of those values $P_4$(t+1) which is higher in likelihood than the other is selected as the pathmetric for status $S_4$(t+1). That procedure is represented in FIG. 1 by path or step [2].

As can be understood, the calculation of the pathmetric for the status $S_0$(t+1) immediately followed by the calculation of the pathmetric for the status $S_4$(t+1) in the aforementioned manner is advantageous in that the data $P_0$(t), $P_1$(t) and $B_0$(t+1) used for calculating the pathmetric for the status $S_0$(t+1) is utilized again for the purpose of calculating the pathmetric for the status $S_4$(t+1). In this manner, the steps [3] through [8] are executed in that order to obtain pathmetrics $P_1$(t+1), $P_5$(t+1), $P_2$(t+1), $P_6$(t+1), $P_3$(t+1) and $P_7$(t+1).

Having obtained all of the pathmetrics at the time point t+1, the operational circuitry proceeds to calculate the pathmetrics at the time point t+2 at the steps [9] through [15] shown in the figure. As may have been understood, the prior art operational circuitry, executing the steps in the orders mentioned above requires, as the statuses increase, the corresponding operational period of time for calculating the pathmetrics, resulting in delay until commencing the calculation of the pathmetrics for the statuses at the successive time points.

SUMMARY OF THE INVENTION

It is therefore an object of the present invention to provide operational circuitry which is improved in operational period of time which would otherwise be extensively required for increased statuses.

In accordance with the present invention, digital operational circuitry comprises: a first adder/subtractor for receiving first and second input data and adding the first and second input data to develop first resultant data; a second adder/subtractor for receiving the first input data and third input data and adding the first and third input data to develop second resultant data; a first comparator operative in response to the first and second resultant data for comparing likelihood of the first and second resultant data to develop first data; a first selector operative in response to the first data for selecting either of the first and second resultant data to develop second data; a first storage circuit for storing the second data; a third adder/subtractor for receiving the second data from said first storage circuit and the third input data and adding the second data and the third input data to develop third resultant data; a fourth adder/subtractor for receiving the second data from said first storage circuit and fourth input data and adding the second data and the fourth input data to develop fourth resultant data; a second comparator operative in response to the third and fourth resultant data for comparing likelihood of the third and fourth resultant data to develop third data; and a second selector operative in response to the third data for selecting either of the third and fourth resultant data to develop fourth data.

Further in accordance with the invention, a method of operating digital data comprises the steps of: providing first and second input data to a first adder/subtractor and adding the first and second input data by the first adder/subtractor to develop first resultant data; providing the first input data and third input data to a second adder/subtractor and adding the first and third input data by the second adder/subtractor to develop second resultant data; comparing likelihood of the first and second resultant data to develop first data; selecting either of the first and second resultant data on the basis of the first data to develop second data; storing the second data in a first storage circuit; providing the second data from the first storage circuit and the third input data to a third adder/subtractor and adding the second data and the third input data by the third adder/subtractor to develop third resultant data; providing the second data from the first storage circuit and fourth input data to a fourth adder/subtractor and adding the second data and the fourth input data by the fourth adder/subtractor to develop fourth resultant data; comparing likelihood of the third and fourth resultant data to develop third data; and selecting either of the third and fourth resultant data on the basis of the third data to develop fourth data.

More specifically, in accordance with the invention, digital operational circuitry includes a first adder/subtractor for adding a first pathmetric to a first branchmetric to develop a first value of pathmetric, and a second adder/subtractor for subtracting the first branchmetric from a second pathmetric to develop a second value of pathmetric. The addition and subtraction are performed by the first and second adder/subrtactors complementarily to each other. The first and second values of pathmetric are compared in likelihood to each other, and in response to the results from the comparison, either of the first and second values of pathmetric is selected and stored in a storage circuit. The circuitry also includes a third adder/subtractor for adding the pathmetric read out from the storage to a second branchmetric to develop a third value of pathmetric, and a fourth adder/subtractor for subtracting the second branchmetric from the pathmetric read out from the storage to develop a fourth value of pathmetric. The third and fourth values of pathmetric are compared in likelihood, and in response to the comparison results either of the third and fourth values of pathmetric is developed as a pathmetric.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
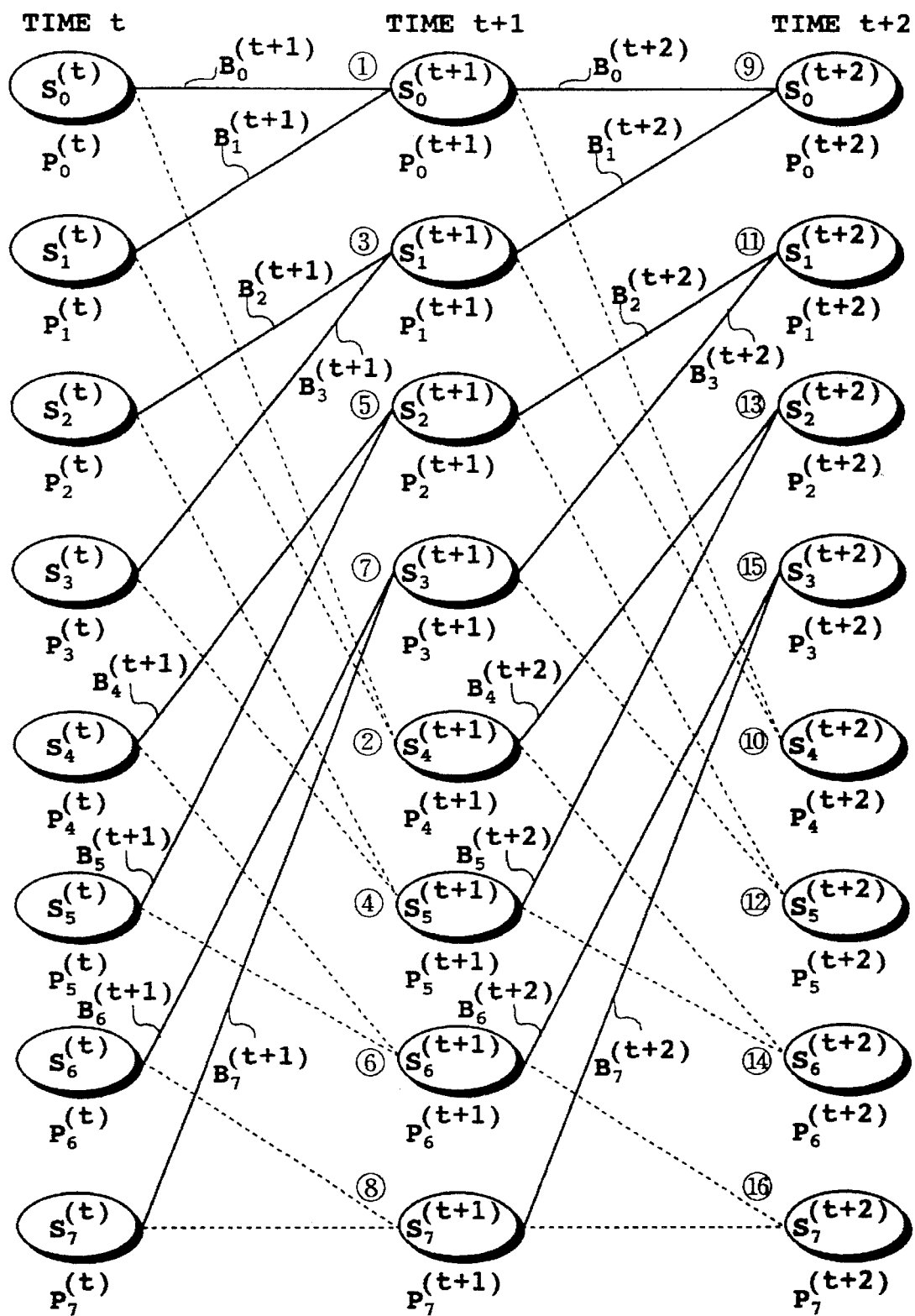
FIG. 1 is a Trellis diagram showing eight internal statuses established in the conventional, convolutional encoder implemented by a prior art degital signal processor at three discrete time points.
Figure 2:
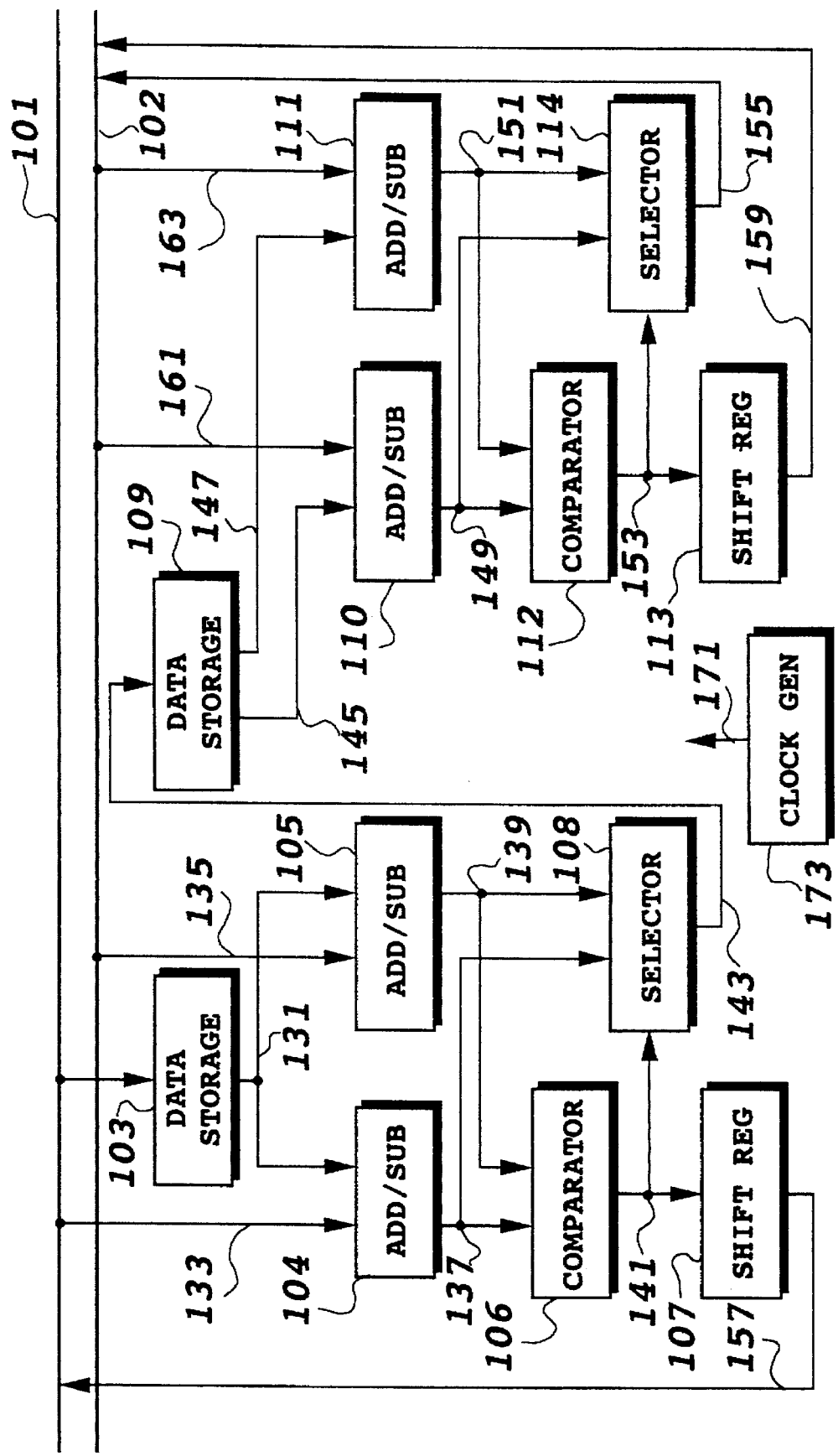
FIG. 2 is a schematic block diagram showing a preferred embodiment of a convolutional encoder implemented by a degital signal processor in accordance with the present invention.

With reference to FIG. 2, an illustrative, preferred embodiment of a convolutional encoder implemented by a digital signal processor in accordance with the present invention is operative in timed with clocks 171, which are generated by a clock generator 173 in the system and define discrete time points t+i, where $i$ is a null or any integer. The embodiment includes a couple of data buses 101 and 102, which are interconnected to a processor system, specifically a main control and/or a main memory of the system, not shown. Each of data buses 101 and 102 have the bit width of two bytes of data, i.e. sixteen bits of data, in parallel in the instant embodiment.

The illustrative embodiment includes clock generator 137, which is adapted to generate clocks 171. Clock gnenerator 137 may be comprised of a self-running oscillator generating a reference clock, or alternatively be adapted to receive system clock pulses from the system, in which the digital signal processor implementing the convolutional encoder is included, to form and distribute appropriate clock pulses on the basis of the received system clock pulses to the constituent elements, such as registers, of the digital signal processor. Clocks 171 may however not necessarily be synchronous with the system clock pulses provided from an application, i.e. the convolutional encoder with the embodiment.

One data bus 101 is interconnected to a data storage 103, which is adapted to store data to be added or subtracted. Data storage 103 has an output port 131 interconnected to one input of adder/subtractors 104 and 105. Adder/subtractors 104 and 105 have other inputs 133 and 135 interconnected to data buses 101 and 102, respectively, and are adapted to add and subtract data provided from buses 101 and 102. Adder/subtractors 104 and 105 have outputs 137 and 139, respectively, interconnected on one hand to inputs of a comparator 106 and on the other hand to inputs of a selector 108.

Comparator 106 is adapted to compare, with respect to likelihood, resultant data provided on its inputs 137 and 139 from adder/subtractors 104 and 105, respectively, to develop a bit of results from the comparison on its output port 141. In the specific illustrative embodiment, comparator 106 is designed to develop a bit "0" when data on its one input 137 is higher in likelihood than data on its other input 139, and otherwise a bit "1". Output port 141 is interconncted to a control input of selector 108 and an input of a shift register 107. Selector 108 is responsive to the one bit signal provided from comparator 106 on its control input 141 to select either one of inputs 137 and 139 to connect the selected one to its output 143. Shift register 107 has its storage positions associated with the bit width of bus 101, and is adapted to receive a bit, representative of results of the comparison from comparator 106, and shift the received bit in its storage positions sequentially. Shift register 107 has a bit parallel output 157 connected to data bus 101 to deliver the data stored in it to bus 101 in a bit parallel fashion.

Output 143 from selector 108 is interconnected to another data storage 109, which is adapted to store the data resultant from the selection made by selector 108. Data storage 109, which may be of the structure similar to that of data storage 103, has output ports 145 and 147 interconnected to one input of other adder/subtractors 110 and 111. Adder/subtractors 110 and 111 have other input ports 161 and 163 connected to data bus 102, and are, similarly to adder/subtractors 104 and 105, respectively, adapted to add and subtract data provided from data storage 109 and from data bus 102. Adder/subtractors 110 and 111 have outputs 149 and 151, respectively, interconnected on one hand to inputs of another comparator 112 and on the other hand to inputs of another selector 114.

Comparator 112 is also adapted, similarly to comparator 106, to compare, with respect to likelihood, resultant data on its inputs 149 and 151 from adder/subtractors 110 and 111, respectively, to develop a bit of results from the comparison on its output port 153. In the specific embodiment, comparator 112 is also designed to produce a bit "0" when data on its one input 149 is higher in likelihood than data on its other input 151, and otherwise a bit "1". Output port 153 is interconncted to a control input of selector 114 and an input of another shift register 113. Selector 114 is also adapted to be responsive to the one bit provided from comparator 112 on its control input 153 to select either one of inputs 149 and 151 to connect the selected one to its output 155. Similarly to shift register 107, shift register 113 has also storage positions associated with the bit width of bus 102, and is adapted to receive a bit, representing the results of the comparison from comparator 112, and shift the received bit in its storage positions sequentially. The data stored in shift register 113 is developed from its output port 159 onto data bus 102 in bit parallel.

All of the constituent elements of the illustrative embodiments of the digital signal processor are operative in timed with clock signals 171 generated by clock generator 173 in the system. In the figures, the connections between clock generator 173 and the constituent elements are omitted and symbolically shown by the single arrow 171, merely for simplicity.

Figure 3:
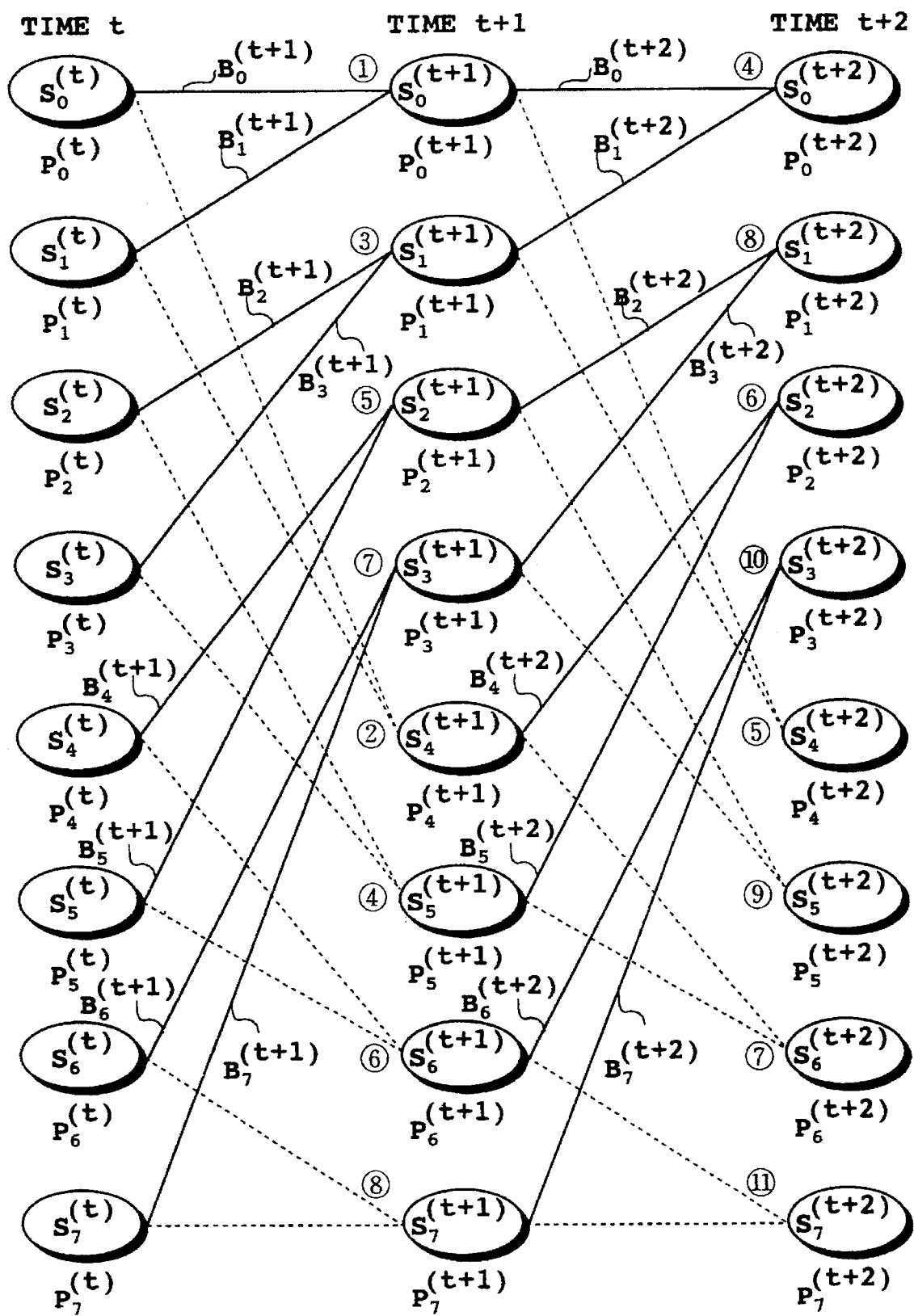
FIG. 3 is a Trellis diagram, similar to FIG. 1, showing eight internal statuses established in the embodiment shown in FIG. 2.

In operation, with reference to FIG. 3 in addition, at the time point t+1, adder/subtractors 104 and 105 receive pathmetrics $P_0(t)$ and $P_1(t)$ from data bus 101 and 102, respectively. Data storage 103 receives from bus 101 and stores therein branchmetric $B_0(t+1)$ to provide adder/subtractors 104 and 105 with the branchmetric thus stored from connention 131. Those data, such as branchmetrics, are resultant from the processings executed by the operational circuits, such as a multiply and accumulation (MAC), included in the digital signal processor implementing the convolutional encoder, for example. In response to those data received, the one adder/subtractor 104 adds received pathmetric $P_0(t)$ to branchmetric $B_0(t+1)$ to get the value of $P_0(t+1)$, and the other adder/subtractor 105 subtracts received branchmetric $B_0(t+1)$ from pathmetric $P_1(t)$ to get the value of $P_0(t+1)$. The values of $P_0(t+1)$ thus obtained are developed from adder/subtractors 104 and 105 to both comparator 106 and selector 108 over connections 137 and 139. As understood from the above description, the pair of adder/subtractors 104 and 105 work complementarily to each other. More specifically, one of the adder/subtractors, 104, for example, is operative to add data while the other, 105, subtract data, and vice versa. In the description, the word "add" may sometimes be used as including subtraction. That is the case because subtraction involves a kind of addition with the sign of data inverted.

Comparator 106 compares in turn, with respect to likelihood, the values of $P_0(t+1)$ thus provided on its inputs 137 and 139 from adder/subtractors 104 and 105, respectively, to develop a bit "0" on its output 141 when the value of $P_0(t+1)$ on its one input 137 is higher in likelihood than the value of $P_0(t+1)$ on its other input 139, and otherwise a bit "1". Shift register 107 receives a bit representing the results of the comparison from comparator 106, and stores it in its first storage position with the remaining bits included therein shifted by one bit position.

On the other hand, selector 108 responds to the one bit received from comparator 106 on its control input 141 to select either one of inputs 137 and 139. When the received bit on its control port 141 is binary "0" or "1", selector 108 is operative to connect the value of $P_0(t+1)$ on its one input 137 or 139 to its output 143, respectively. This means that one of the values of $P_0(t+1)$ provided on its other inputs 137 and 139 which is higher in likelihood than the other is conveyed as the pathmetiric $P_0(t+1)$ to its output 143. The selected pathmetric $P_0(t+1)$ will in turn be stored into data storage 109. The processings mentioned above are designated in FIG. 3 by step [1].

Now proceeding to step [2], data storage 103, and adder/subtractors 104 and 105 maintain therein pathmetrics $P_0(t)$ and $P_1(t)$, and branchmetric $B_0(t+1)$ received in step [1], respectively. In step [2], the one adder/subtractor 104 subtracts stored branchmetric $B_0(t+1)$ from maintained pathmetric $P_0(t)$ to get the value of $P_4(t+1)$, and the other adder/subtractor 105 adds maintained pathmetric $P_1(t)$ to stored branchmetric $B_0(t+1)$ to get the value of $P_4(t+1)$.

In a similar way to step [1], the likelihoods of the values of $P_4(t+1)$ thus obtained are compared by comparator 106. One of the values of $P_4(t+1)$ which has a higher likelihood than the other is transferred to storage 109 as pathmetric $P_4(t+1)$. One-bit data "0" or "1" representing which of the values of $P_4(t+1)$ on inputs 137 and 139 to comparator 106 is higher in likelihood and provided from comparator 106 is inputted to shift register 107 and stored in its first storage position with the remaining bits included therein shifted by one bit position. The data stored in shift register 107 is outputted in bit parallel onto data bus 101. One of the values of $P_4(t+1)$ provided on its other inputs 137 and 139 which is higher in likelihood than the other is transferred as the pathmetiric $P_4(t+1)$ from its output 143 to data storage 109 and will be stored in that data storage 109.

In step [3], pathmetric $P_1(t+1)$ is calculated in a fashion similar to that of step [2]. Further in step [4], adder/subtractors 104 and 105 receive pathmetrics $P_2(t)$ and $P_3(t)$ from data bus 101 and 102, respectively, in a similar way to step [1]. Data storage 103 receives from bus 101 and stores therein branchmetric $B_1(t+1)$ to provide adder/subtractors 104 and 105 with the branchmetric thus stored. One adder/subtractor 104 adds received pathmetric $P_2(t)$ to branchmetric $B_1(t+1)$ to get the value of $P_5(t+1)$, and the other adder/subtractor 105 subtracts received branchmetric $B_1(t+1)$ from pathmetric $P_3(t)$ to get the value of $P_5(t+1)$. In a similar way to step [1], the values of $P_5(t+1)$ thus obtained are compared by comparator 106 with respect to likelihood. One of the values of $P_5(t+1)$ which has a higher likelihood than the other is transferred to storage 109 as pathmetric $P_5(t+1)$. One bit "0" or "1" representing which of the values of $P_5(t+1)$ on inputs 137 and 139 to comparator 106 is higher in likelihood and provided from comparator 106 is transferred to shift register 107 and stored in its first storage position with the remaining bits shifted by one bit position. In addition, one of the values of $P_5(t+1)$ provided on its other inputs 137 and 139 which is higher in likelihood than the other is transferred as the pathmetiric $P_5(t+1)$ from its output 143 to data storage 109 and be stored in that data storage 109.

Now briefly referring to successive time point t+2, in step [4], another pathmetric $P_0(t+2)$ can be obtained by using pathmetrics $P_0(t+1)$ and $P_1(t+1)$, which have been established in steps [1] and [3], respectively. This operation is accomplished by the circuitry shown in the righthand part of FIG. 2. As will be understood, the lefthand part of the circuitry shown in FIG. 2 is operative to calculate data associated a time point, t+1, for example, while the righthand part thereof to calculate data associated with another discrete time point, t+2, which follows the earlier-mentioned time point t+1.

More specifically, in step [4], data storage 109 contains pathmetrics $P_0(t+1)$ and $P_1(t+1)$ obtained in steps [1] and [3]. Pathmetrics $P_0(t+1)$ and $P_1(t+1)$ are transferred from data storage 109 to adder/subtractors 110 and 111, repsectively, both of which will receive branchmetric $B_0(t+2)$ from data bus 102 through connections 161 and 163, respectively. Adder/subtractors 110 in turn adds received pathmetric $P_0(t+1)$ to branchmetric $B_0(t+2)$ to obtain the value of $P_0(t+2)$, and adder/subtractor 111 subtracts received branchmetric $B_0(t+2)$ from pathmetric $P_1(t+1)$ to obtain the value of $P_0(t+2)$. The values of $P_0(t+2)$ thus calculated are delivered from adder/subtractors 110 and 111 to both comparator 112 and selector 114 over connections 149 and 151.

Comparator 112 compares in turn, with respect to likelihood, the values of $P_0(t+2)$ thus provided on its inputs 149 and 151 from adder/subtractors 110 and 111, respectively, to produce a bit "0" on its output 153 when the value of $P_0(t+2)$ on its one input 149 is higher in likelihood than the value of $P_0(t+2)$ on its other input 151, and otherwise a bit "1". Shift register 113 receives a bit representing the results of the comparison from comparator 112, and stores it in its first storage position with the remaining bits contained therein shifted by one bit position.

On the other hand, selector 114 responds to the one bit received from comparator 112 on its control input 153 to select either one of inputs 149 and 151. When the received bit on its control port 153 is binary "0" or "1", selector 114 is operative to connect the value of $P_0(t+2)$ on its one input 149 or 151 to its output 155, respectively. As a result, one of the values of $P_0(t+2)$ provided on its other inputs 149 and 151 which is higher in likelihood than the other is conveyed as the pathmetiric $P_0(t+2)$ to its output 155, and finally to data bus 102. In that manner, pathmetric $P_0(t+2)$ has been obtained.

Now proceeding to step [5], pathmetrics $P_2(t+1)$ and $P_4(t+2)$ are simultaneously obtained in a similar way described above in connection with step [4]. Following this, step [6] is performed to simultaneously obtain pathmetrics $P_6(t+1)$ and $P_2(t+2)$, and then, step [7] is done to simultaneously get pathmetrics $P_3(t+1)$ and $P_6(t+2)$. Further, step [8] is executed to simultaneously obtain pathmetrics $P_7(t+1)$ and $P_1(t+2)$. Then, step [9] is performed to get pathmetrics $P_5(t+2)$, following step [10] is done to calculate pathmetric $P_3(t+2)$, and finally pathmetric $P_7(t+2)$ is established in step [11]. Those processings give rise to all of the pathmetrics in the statuses defined at the time points t+1 and t+2. The data stored in shift registers 107 and 113 will be outputted in bit parallel onto data buses 101 and 102, when all processings required for calculating the pathmetrics for two discrete time points t+1 and t+2 have been completed.

Now referring to FIG. 4, an alternative embodiment of the invention is identical with what is described with reference to FIG. 2 except for a third data storage 301 provided between data bus 102 and input ports 161 and 163 of adder/subtractors 110 and 111, respectively, with those input ports 161 and 163 interconnected in common to an output port of data storage 301. In the following description, the like elements are denoted by the same reference numerals shown in FIG. 2.

Figure 4:
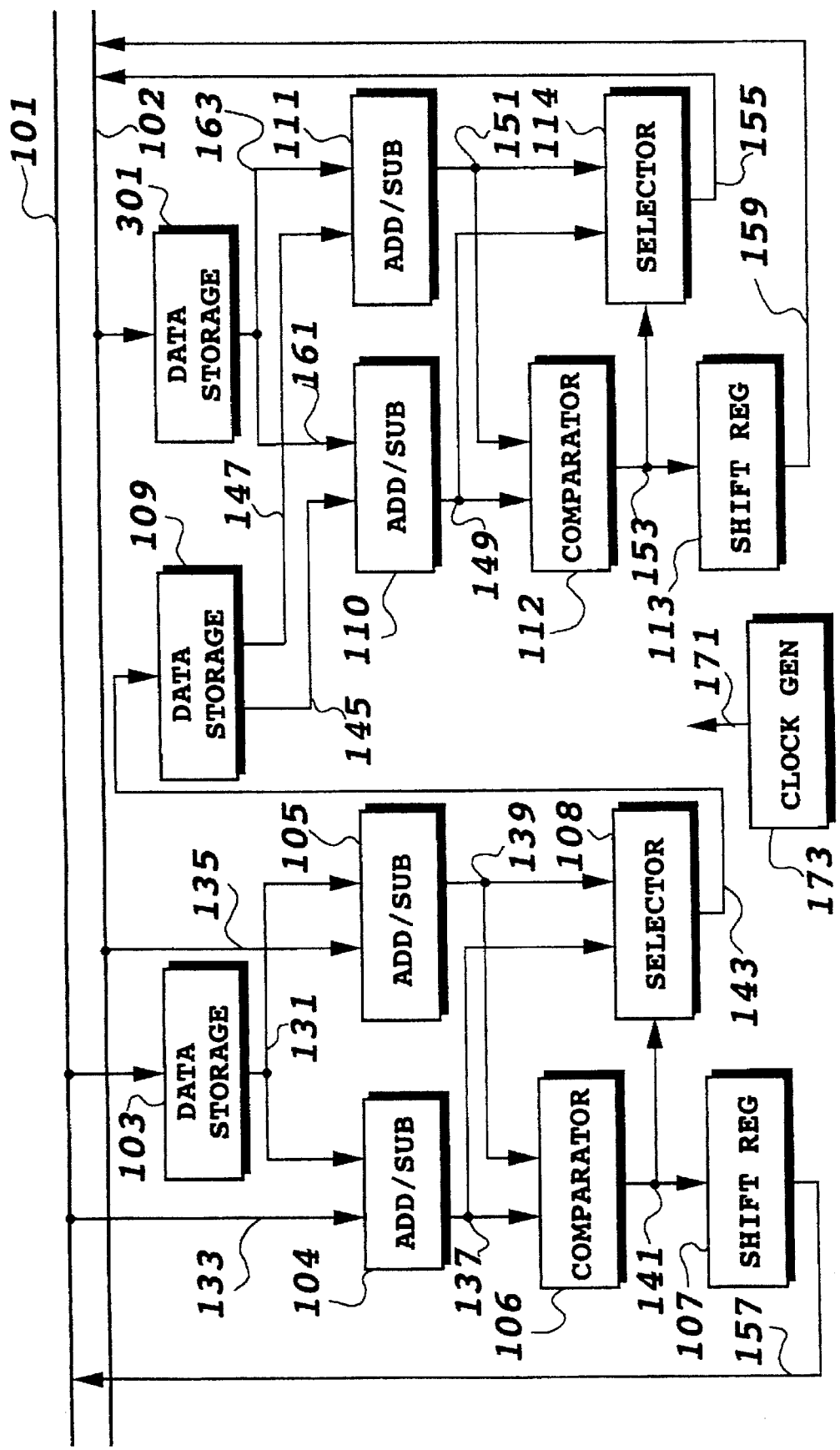
FIG. 4 is a schematic block diagram, similar to FIG. 2, showing an alternative embodiment of a convolutional encoder in accordance with the present invention.

In operation, the alternative embodiment shown in FIG. 4 operates in the manner similar to that of the embodiment shown in FIG. 2 except for data storage 301 and the circuitry associated therewith. For example, during the operations defined at discrete time points t+1 and t+2 for the purpose of performing addition and subtraction in adder/subtractors 110 and 111 as described above with reference to FIG. 2, the third data storage 301 receives from data bus 102 and stores therein branchmetrics, which will in turn be developed to both of adder/subtractors 110 and 111 over connections 161 and 163, respectively.

With the alternative embodiment shown in FIG. 4, the provision of the third data storage 301 removes the necessity of, each time adder/subtractors 110 and 111 are going to perform arithmetic operations on brachmetrics, fetching such branchmetrics over data bus 102 from a system memory, not shown, as required in the embodiment shown in FIG. 2. This will also decrease the processing period of time required for fetching such branchmetrics.

In the illustrative embodiments described above, with the convolutional encoder with eight internal statuses involved (constraint length K=4), it takes eleven steps to obtain pathmetrics at two discrete time points, resulting in shortening the processing period of time, whereas it took sixteen steps as described in the conventional, convolutional encoder. With the North American standard, the CDMA (Code Division Multiple Access) system, for example, which has 256 statuses (constraint length K=9), the invention would require 259 steps whereas the conventional signal processor did 512 steps, which were approximately twice as many as the invention.

In the prior art, the pathmetrics calculated and selected were stored in a temporary storage, in which they are re-arranged in the order of the status numbers, $S_0$, $S_1$, $S_2$, . . , in respect of respective time points. With the present illustrative embodiments, such re-arrangements in the order are required every two time points, reducing the steps of program sequences required for re-arranging the order substantially half as much as in the prior art.

In the embodiments described above, the data representative of the comparison results by comparators 106 and 112 stored in shift registers 107 and 113 with respect to two discrete time points t+1 and t+2 may simultaneously be developed onto a pair of data buses 101 and 102, respectively. By contrast, in the prior art, such comparison data were stored in a shift register with respect of a certain time point, and developed over a data bus to be saved into a data memory whenever the full bits of data are stored in the shift register. The illustrative embodiments require steps of program sequences for the comparison and data saving approximately half as muny as the prior art.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What we claim is:

1. Digital operational circuitry comprising:

a first adder/subtractor for receiving first and second input data and adding the first and second input data to develop first resultant data;

a second adder/subtractor for receiving the first input data and third input data and adding the first and third input data to develop second resultant data;

a first comparator operative in response to the first and second resultant data for comparing likelihood of the first and second resultant data to develop first data;

a first selector operative in response to the first data for selecting either of the first and second resultant data to develop second data;

a first storage circuit for storing the second data;

a third adder/subtractor for receiving the second data from said first storage circuit and the third input data and adding the second data and the third input data to develop third resultant data;

a fourth adder/subtractor for receiving the second data from said first storage circuit and fourth input data and adding the second data and the fourth input data to develop fourth resultant data;

a second comparator operative in response to the third and fourth resultant data for comparing likelihood of the third and fourth resultant data to develop third data; and a second selector operative in response to the third data for selecting either of the third and fourth resultant data to develop fourth data.

2. Circuitry in accordance with claim 1, further comprising a second storage circuit for receiving the first input data and storing the first input data to provide said first and second adder/subtactors with the first input data thus stored.

3. Circuitry in accordance with claim 2, further comprising:

a first data bus on which the first and second input data are conveyed, said first data bus being interconnected to said first adder/subtractor and first storage; and a second data bus on which the third and fourth input data, and the fourth data are conveyed, said second data bus being interconnected to said second, third and fourth adder/subtractors, and second selector.

4. Circuitry in accordance with claim 3, further comprising:

a first shift register for receiving and storing the first data and having first storage positions through which the first data are shifted, the first storage positions being interconnected to said first bus; and a second shift register for receiving and storing the third data and having second storage positions through which the third data are shifted, the second storage positions being interconnected to said second bus.

5. Circuitry in accordance with claim 1, further comprising a third storage circuit for receiving the third and fourth input data and storing the third and fourth input data to provide said third and fourth adder/subtractors with the third and fourth input data thus stored.

6. Circuitry in accordance with claim 5, further comprising:

a first data bus on which the first and second input data are conveyed, said first data bus being interconnected to said first adder/subtractor and first storage; and a second data bus on which the third and fourth input data, and the fourth data are conveyed, said second data bus being interconnected to said second adder/subtractor, third storage circuit and second selector.

7. Circuitry in accordance with claim 1, further comprising a clock generator for generating clock signals defining a series of discrete time points and supplying said first storage circuit with the clock signals to cause said first storage circuit to be operative in timed with the clock signals.

8. Circuitry in accordance with claim 7, wherein the first and third input data comprises a signal representative of a pathmetric defined by first one of the time points, the second input data comprising a signal representative of a branchmetric defined by second one of the time points which is successive to the first time point.

9. Circuitry in accordance with claim 8, wherein said first and second adder/subtractors are operative in timed with the clock signals to be an adder and a subtractor complementarily to each other.

10. Circuitry in accordance with claim 8, wherein said circuitry is a convolutional encoder for producing the fourth data as convolutional codes.

11. A method of operating digital data, comprising the steps of:

providing first and second input data to a first adder/subtractor and adding the first and second input data by the first adder/subtractor to develop first resultant data;

providing the first input data and third input data to a second adder/subtractor and adding the first and third input data by the second adder/subtractor to develop second resultant data;

comparing likelihood of the first and second resultant data to develop first data;

selecting either of the first and second resultant data on the basis of the first data to develop second data;

storing the second data in a first storage circuit;

providing the second data from the first storage circuit and the third input data to a third adder/subtractor and adding the second data and the third input data by the third adder/subtractor to develop third resultant data;

providing the second data from the first storage circuit and fourth input data to a fourth adder/subtractor and adding the second data and the fourth input data by the fourth adder/subtractor to develop fourth resultant data;

comparing likelihood of the third and fourth resultant data to develop third data; and selecting either of the third and fourth resultant data on the basis of the third data to develop fourth data.

12. A method in accordance with claim 11, further comprising the steps of:

storing the first input data in a second storage circuit; and reading out the first input data from the second storage circuit to provide the first and second adder/subtactors with the first input data thus read out.

13. A method in accordance with claim 11, further comprising the steps of:

storing the third and fourth input data in a third storage circuit; and reading out the third and fourth input data from the third storage circuit to provide the third and fourth adder/subtactors with the third and fourth input data thus read out.

* * * * *